(12) United States Patent
Chang et al.

(10) Patent No.: US 9,558,930 B2
(45) Date of Patent: Jan. 31, 2017

(54) MIXED LITHOGRAPHY APPROACH FOR E-BEAM AND OPTICAL EXPOSURE USING HSQ

(71) Applicant: International Business Machines Corporation, Armonk, NY (US)

(72) Inventors: Josephine B. Chang, Mahopac, NY (US); Szu-Lin Cheng, Yorktown Heights, NY (US); Isaac Lauer, Yorktown Heights, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 35 days.

(21) Appl. No.: 14/458,887

(22) Filed: Aug. 13, 2014

(65) Prior Publication Data

US 2016/0049294 A1 Feb. 18, 2016

(51) Int. Cl.
*H01L 23/532* (2006.01)
*H01L 21/02* (2006.01)
*H01L 21/311* (2006.01)
*H01L 21/768* (2006.01)
(Continued)

(52) U.S. Cl.
CPC ... *H01L 21/02134* (2013.01); *H01L 21/02282* (2013.01); *H01L 21/02351* (2013.01); *H01L 21/31116* (2013.01); *H01L 21/31144* (2013.01); *H01L 21/324* (2013.01); *H01L 21/76877* (2013.01); *H01L 23/528* (2013.01); *H01L 23/53228* (2013.01)

(58) Field of Classification Search
CPC ........... H01L 21/76808; H01L 21/7681; H01L 21/76825; H01L 21/02134; H01L 21/02351

See application file for complete search history.

(56) References Cited

U.S. PATENT DOCUMENTS

| 6,080,526 A | * | 6/2000 | Yang | ................. H01L 21/02134 257/E21.259 |
| 6,083,850 A | | 7/2000 | Shields | |
| 6,084,290 A | | 7/2000 | Shields | |

(Continued)

OTHER PUBLICATIONS

S. Choi et al., "Comparative study of thermally cured and electron-beam-exposed hydrogen silsesquioxane resists," J. Vac. Sci. Technol. B 26(5) (Sep./Oct. 2008).

(Continued)

*Primary Examiner* — Bradley K Smith
*Assistant Examiner* — David Goodwin
(74) *Attorney, Agent, or Firm* — Louis J. Percello; Michael J. Chang, LLC (57) ABSTRACT

In one aspect, a method of forming a wiring layer on a wafer is provided which includes: depositing a HSQ layer onto the wafer; cross-linking a first portion(s) of the HSQ layer using e-beam lithography; depositing a hardmask material onto the HSQ layer; patterning the hardmask using optical lithography, wherein the patterned hardmask covers a second portion(s) of the HSQ layer; patterning the HSQ layer using the patterned hardmask in a manner such that i) the first portion(s) of the HSQ layer remain and ii) the second portion(s) of the HSQ layer covered by the patterned hardmask remain, wherein by way of the patterning step trenches are formed in the HSQ layer; and filling the trenches with a conductive material to form the wiring layer on the wafer.

16 Claims, 3 Drawing Sheets

(51) Int. Cl.
  *H01L 21/324* (2006.01)
  *H01L 23/528* (2006.01)

(56) References Cited

U.S. PATENT DOCUMENTS

| | | | |
|---|---|---|---|
| 6,271,127 B1 * | 8/2001 | Liu | H01L 21/7681 257/E21.579 |
| 6,323,118 B1 * | 11/2001 | Shih | H01L 21/31116 257/E21.252 |
| 6,355,575 B1 | 3/2002 | Wang et al. | |
| 6,790,788 B2 * | 9/2004 | Li | C23C 16/325 216/13 |
| 6,946,736 B2 | 9/2005 | Gleason et al. | |
| 7,476,611 B2 | 1/2009 | Kunishima et al. | |
| 7,914,970 B2 * | 3/2011 | Fuller | G03F 7/0035 430/296 |
| 8,158,334 B2 | 4/2012 | Gabor et al. | |
| 8,334,090 B2 | 12/2012 | Fuller et al. | |
| 2003/0203619 A1 * | 10/2003 | Abe | H01L 21/76807 438/637 |
| 2005/0233564 A1 * | 10/2005 | Kitada | H01L 21/76877 438/597 |
| 2015/0187602 A1 * | 7/2015 | Kim | H01L 21/467 428/195.1 |

OTHER PUBLICATIONS

M.A. Mohammad et al., "Fundamentals of Electron Beam Exposure and Development," Nanofabrication, Techniques and Principles, M. Stepanova and D. Dew (eds.), pp. 11-41, 2012, VIII, ISBN: 978-3-7091-0423-1 (2012).

* cited by examiner

MIXED LITHOGRAPHY APPROACH FOR E-BEAM AND OPTICAL EXPOSURE USING HSQ

FIELD OF THE INVENTION

The present invention relates to mixed lithography techniques, and more particularly, to mixed lithography techniques for electron-beam (e-beam) and optical exposure performed entirely in hydrogen silsesquioxane (HSQ).

BACKGROUND OF THE INVENTION

Mixed lithography refers to lithographic processes involving more than one exposure source to create an image in a single layer of resist. See, for example, U.S. Pat. No. 8,334,090 issued to Fuller et al., entitled "Mixed lithography with dual resist and a single pattern transfer," which involves use of an inorganic electron beam (e-beam) sensitive oxide layer which is exposed with an e-beam, and an ultraviolet sensitive photoresist layer which is exposed with an ultraviolet radiation. A mixed lithography approach allows one to take advantage of the lithography process best suited to produce particular features.

Hydrogen silsesquioxane (HSQ) is a material of interest for device fabrication since it can serve as both a low dielectric constant dielectric layer and as a resist material for high-resolution e-beam lithography. See, for example, S. Choi et al., "Comparative study of thermally cured and electron-beam-exposed hydrogen silsesquioxane resists," J. Vac. Sci. Technol. B 26(5) (September/October 2008).

In the context of mixed lithography, for example, one might first deposit and pattern a dielectric using an optical lithography process, such as reactive ion etching (RIE). Next, HSQ is deposited and exposed using e-beam lithography. The different optical lithography and e-beam lithography exposures combine to create a common image in the sample. This process, however, involves multiple deposition, masking, and etching steps which increases the overall complexity and cost of manufacture.

Thus, improved mixed lithography techniques would be desirable.

SUMMARY OF THE INVENTION

The present invention provides mixed lithography techniques for electron-beam (e-beam) and optical exposure performed entirely in hydrogen silsesquioxane (HSQ). In one aspect of the invention, a method of forming a wiring layer on a wafer is provided which includes the steps of: depositing a layer of HSQ onto the wafer; cross-linking one or more first portions of the HSQ layer in a first region of the wafer using e-beam lithography; depositing a hardmask material onto the HSQ layer; patterning the hardmask material to form a patterned hardmask on the HSQ layer using optical lithography, wherein the patterned hardmask covers one or more second portions of the HSQ layer in a second region of the wafer; patterning the HSQ layer using the patterned hardmask in a manner such that i) the one or more first portions of the HSQ layer that are cross-linked remain in the first region of the wafer and ii) the one or more second portions of the HSQ layer covered by the patterned hardmask remain in the second region of the wafer, wherein by way of the patterning step one or more first trenches are formed in the HSQ layer in the first region of the wafer and one or more second trenches are formed in the HSQ layer in the second region of the wafer; and filling the one or more first trenches in the first region of the wafer and the one or more second trenches in the second region of the wafer with a conductive material to form the wiring layer on the wafer.

In another aspect of the invention, another method of forming a wiring layer on a wafer is provided which includes the steps of: depositing a layer of HSQ onto the wafer; cross-linking one or more first portions of the HSQ layer in a first region of the wafer using e-beam lithography; depositing a photoresist material onto the HSQ layer; patterning the photoresist material and the HSQ layer together using optical lithography such that the photoresist material, once patterned, covers one or more second portions of the HSQ layer in a second region of the wafer, wherein the patterning step is carried out in a manner such that i) the one or more first portions of the HSQ layer that are cross-linked remain in the first region of the wafer and ii) the one or more second portions of the HSQ layer covered by the patterned photoresist material remain in the second region of the wafer, and wherein by way of the patterning step one or more first trenches are formed in the HSQ layer in the first region of the wafer and one or more second trenches are formed in the HSQ layer in the second region of the wafer; and filling the one or more first trenches in the first region of the wafer and the one or more second trenches in the second region of the wafer with a conductive material to form the wiring layer on the wafer.

In yet another aspect of the invention, a semiconductor device wiring structure is provided. The semiconductor device wiring structure includes: a wafer; an HSQ layer on the wafer, wherein the HSQ layer has one or more first trenches formed therein in a first region of the wafer and one or more second trenches formed therein in a second region of the wafer, and wherein the one or more first trenches formed in the HSQ layer in the first region of the wafer have a smaller feature size than the one or more second trenches formed in the HSQ layer in the second region of the wafer; and a conductive material in the one or more first trenches formed in the HSQ layer in the first region of the wafer and in the one or more second trenches formed in the HSQ layer in the second region of the wafer.

A more complete understanding of the present invention, as well as further features and advantages of the present invention, will be obtained by reference to the following detailed description and drawings.

DETAILED DESCRIPTION OF PREFERRED EMBODIMENTS

Provided herein are mixed lithography techniques wherein electron-beam (e-beam) and optical exposures are performed entirely in hydrogen silsesquioxane (HSQ). The present techniques will be described herein in the context of patterning an image for metallization on a wafer, wherein a dense region(s) of the pattern is formed using e-beam defined HSQ and a relaxed region(s) of the pattern is formed using optically defined HSQ. However, it is to be understood that the present techniques are more broadly applicable to any mixed lithography applications.

The present techniques will now be described in detail by way of reference to FIGS. 1-12. FIGS. 1-7 illustrate one exemplary process employing the present techniques to form a metal wiring layer on a wafer. The wiring layer/wafer structure may also be referred to herein as a semiconductor device wiring structure since it can be used as the platform for a variety of different semiconductor device and circuit configurations. The exemplary embodiment illustrated in FIGS. 1-7 employs a hardmask during the optical lithography phase. An alternative embodiment is illustrated in FIGS. 8-12 and described below in which the hardmask is forgone in lieu of an optical photoresist "softmask."

Figure 1:
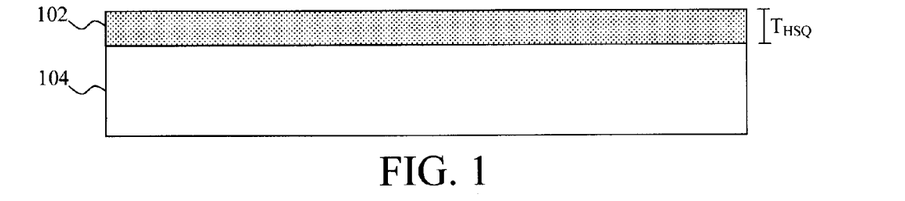
FIG. 1 is a cross-sectional diagram illustrating a layer of hydrogen silsesquioxane (HSQ) having been deposited onto a wafer according to an embodiment of the present invention.

As shown in FIG. 1, the process begins by depositing a layer of HSQ 102 onto the wafer 104. According to an exemplary embodiment, the HSQ layer 102 is deposited to a thickness $T_{HSQ}$ of from about 10 nanometers (nm) to about 200 nm, and ranges therebetween. According to an exemplary embodiment, wafer 104 is a bulk semiconductor wafer, such as a bulk silicon, germanium, silicon germanium, etc. wafer.

By way of example only, the HSQ may be deposited onto the wafer from a solution by spin-coating. Following deposition, an optional anneal (also referred to herein as a pre-bake) can be performed to remove the solvent from the HSQ solution on the wafer. Suitable pre-bake conditions include, for example, heating on a hot plate at a temperature of from about 150 degrees Celsius (° C.) to about 180° C., and ranges therebetween, for a duration of from about 10 minutes to about 20 minutes, and ranges therebetween.

Figure 2:
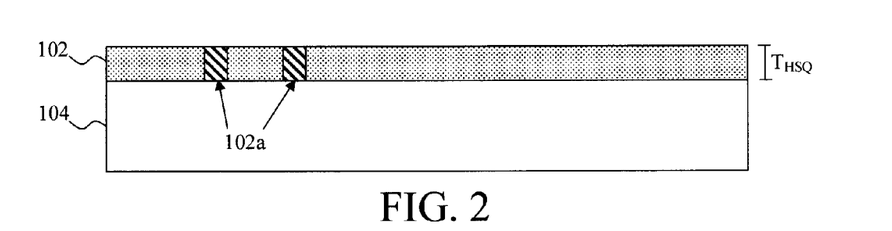
FIG. 2 is a cross-sectional diagram illustrating e-beam lithography having been used to expose one or more portions of the HSQ layer according to an embodiment of the present invention.

Next, as shown in FIG. 2, e-beam lithography is used to expose one or more portions of the HSQ layer 102. The e-beam exposure will be used to cross-link the portions of the HSQ to which it is exposed. Upon cross-linking, HSQ forms an insoluble silica-like structure (which is similar to silicon dioxide). Thus, a developer can be subsequently used to remove uncross-linked portions of the HSQ selective to the cross-linked portions. See below.

It is notable that, according to this exemplary embodiment, not all of the uncross-linked HSQ remaining after the e-beam exposure will be removed. Specifically, one or more portions of the uncross-linked HSQ will (via optical lithography) be patterned to form a 'relaxed' portion of the wiring layer. As will be described in detail below, those uncross-linked portions of the HSQ that are to remain will be protected during development by a hardmask (or in the alternative a softmask).

E-beam lithography generally involves exposing portions of a sample (in this case the HSQ layer 102) to a highly focused electron beam to change the properties of the exposed portions of the sample, thereby allowing selective treatment of the sample with a developer. See, for example, M. A. Mohammad et al., "Fundamentals of Electron Beam Exposure and Development," *Nanofabrication, Techniques and Principles*, M. Stepanova and D. Dew (eds.), pgs. 11-41, 2012, VIII, ISBN: 978-3-7091-0423-1 (2012) (hereinafter "Mohammad"), the contents of which are incorporated by reference as if fully set forth herein. As highlighted above, e-beam exposure of the HSQ serves to cross-link the exposed portions of the HSQ which permits subsequent selective removal of the uncross-linked portions of the HSQ with a developer.

Hereinafter, the e-beam exposed portions of the HSQ layer 102 are given the reference numeral 102a. The present process leverages the dual nature of HSQ as both a suitable resist material and a dielectric. Specifically, the HSQ is a mixed lithography (i.e., an e-beam and optical lithography patternable) resist material, which permits the HSQ to be patterned using the present mixed lithography process. Then once patterned, the HSQ can serve as a dielectric for a damascene metallization process.

By using a mixed lithography approach, the present techniques benefit from each type of lithography process best suited for a particular application. Namely, e-beam lithography is well suited to pattern structures down to the sub-10 nanometer (nm) dimensions. See, for example, Mohammad. However, it is difficult to pattern an entire wafer using e-beam lithography. Optical lithography, on the other hand, does not enable the fine granularity of e-beam lithography, but is efficient and effective for large-scale patterning. In this exemplary embodiment, e-beam lithography is used to pattern those regions of HSQ that will receive a dense wiring pattern, while optical lithography is used to fill in the pattern in the regions having relaxed feature sizes. By way of example only, a feature size (e.g., the width w of a trench, see below) of from about 10 nm to about 100 nm, and ranges therebetween, is considered herein to be a dense feature size, and a feature size (e.g., the width w of a trench, see below) of from about 200 nm to about 1 micrometer (µm), and ranges therebetween, is considered herein to be a relaxed feature size. Thus the trenches formed during the e-beam lithography phase of the present process will have a smaller feature size than those trenches formed during the optical lithography phase, and vice versa. It is notable however, that the present techniques are generally applicable to any mixed lithography scenario performed entirely in HSQ.

With the e-beam exposure being the first component of the "mixed" lithography process, optical lithography (the second component) is then used to pattern a hardmask on the HSQ layer 102. The term "optical lithography" as used herein refers to a lithography process that uses photons. By contrast, electron-beam (e-beam) lithography uses electrons. The exposure mechanisms for optical and e-beam lithography are different but can generate similar effects. It is notable that HSQ is not sensitive to radiation above 157 nm wavelength. HSQ could be exposed optically but not with a 193 nm, or larger wavelength scanner. Since patterning of the HSQ at this stage is not desired (i.e., the HSQ will be patterned later using a developer (see below)), according to an exemplary embodiment the optical lithography used herein to pattern the hardmask is carried out at a wavelength of 193 nm and above (which will not affect the HSQ). It is also notable that use of a hardmask is however optional in the sense that it may be forgone in lieu of a suitable softmask-based process such as that described in accordance with the exemplary alternative embodiment described in conjunction with the description of FIGS. 8-12, below.

Figure 3:
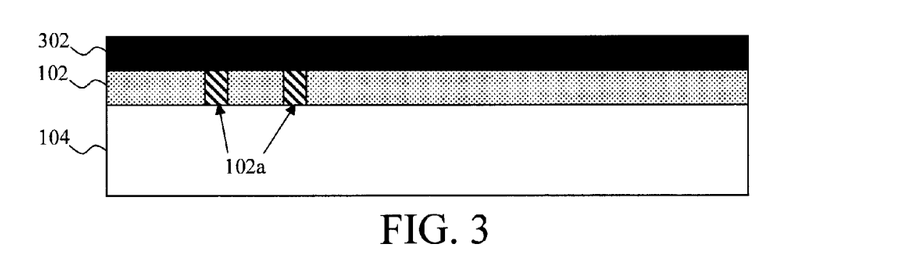
FIG. 3 is a cross-sectional diagram illustrating a hardmask material having been blanket deposited onto the HSQ layer according to an embodiment of the present invention.
Figure 4:
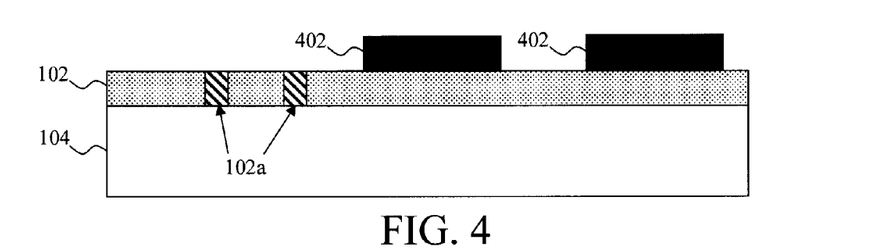
FIG. 4 is a cross-sectional diagram illustrating an optical lithography process having been used to pattern the hardmask material to form a patterned hardmask according to an embodiment of the present invention.

As shown in FIG. 3, the patterned hardmask is formed by first blanket depositing a hardmask material 302 onto the HSQ layer 102 (and onto the e-beam exposed portions 102a of the HSQ layer). By way of example only, suitable hardmask materials include, but are not limited to, silicon dioxide, silicon nitride, and aluminum oxide. Next, as shown in FIG. 4, an optical lithography process is used to pattern the hardmask material 302 to form the patterned hardmask 402 covering at least a portion of the HSQ layer (e.g., portions 502—see below). As is known in the art, optical lithography involves using light exposure and a developer to pattern a photoresist and then transferring the pattern to an underlying substrate (such as the underlying hardmask material).

Figure 5:
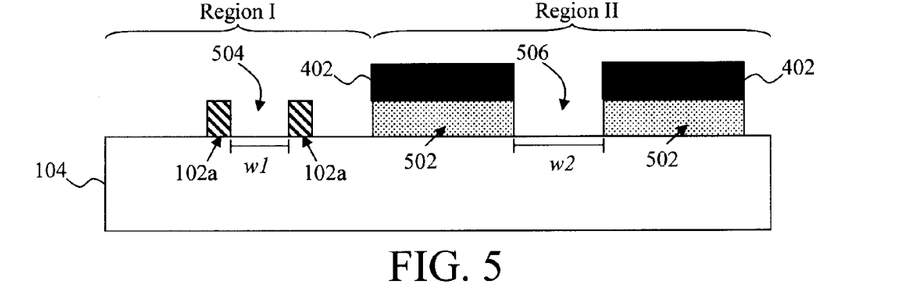
FIG. 5 is a cross-sectional diagram illustrating the patterned hardmask having been used to pattern the HSQ layer forming multiple trenches in the HSQ layer according to an embodiment of the present invention.

As shown in FIG. 5, the patterned hardmask 402 is then used to pattern the HSQ layer 102. In a typical scenario wherein, for example, a patterned hardmask is used to pattern an underlying dielectric, the pattern is often transferred from the hardmask to the dielectric using a standard etching process such as reactive ion etching (RIE). Here however, the goal is to remove i) the uncross-linked portions of the HSQ layer relative to the (e-beam) cross-linked portions 102a of the HSQ layer in one or more first regions of the wafer (e.g., those dense regions labeled "Region I" in FIG. 5) and ii) the unmasked portions of the HSQ layer (i.e., those regions of the HSQ not masked by the patterned hardmask 402) in one or more second regions of the wafer (e.g., those relaxed regions labeled "Region II" in FIG. 5). This is preferably done in a single step.

According to an exemplary embodiment, the uncross-linked portions of the HSQ layer and the unmasked portions of the HSQ layer are removed in a single step using a developer. Suitable developers include, but are not limited to, tetramethylammonium hydroxide (TMAH), sodium hydroxide (NaOH), potassium hydroxide (KOH), and lithium hydroxide (LiOH). See, for example, Mohammad. According to an exemplary embodiment, the wafer is dipped in a developer solution containing one of these developers. The developer solution will remove any exposed uncross-linked HSQ. The patterned hardmask 402 will prevent the developer from contacting the portions of the HSQ layer 102 covered by the hardmask (i.e., optical lithography defined portions 502). While some lateral etching by the developer might occur in these regions, the amount of lateral etching is insignificant compared to the overall surface area of the portions 502 which are masked by patterned hardmask 402.

The result of the developing of the HSQ layer is multiple trenches having been formed in the HSQ layer. As described above, the one or more (first) e-beam lithography patterned trenches (i.e., trenches 504) formed in a first (e.g., dense) Region I of the wafer will have smaller feature sizes relative to the one or more (second) optical lithography patterned trenches (i.e., trenches 506) formed in a second (e.g., relaxed) Region II of the wafer. By way of example only, a feature size, e.g., a width w1 of each of the trenches 504, is from about 10 nm to about 100 nm, and ranges therebetween, and a feature size, e.g., a width w2 of each of the trenches 506 is from about 200 nm to about 1 µm, and ranges therebetween. Further, the present description and drawings serve to illustrate how different scale features can be formed using a mixed lithography approach in HSQ, and it is to be understood that a multitude of different sized patterns can be created using the present techniques including, but not limited to, the dense and relaxed trenches described and shown in the exemplary embodiment.

After the HSQ layer has been developed, the patterned hardmask 402 can be removed. See FIG. 6. By way of example only, the patterned hardmask 402 can be removed using an etching process, such as chemical-mechanical polishing (CMP). While generally considered a sacrificial layer, removal of the patterned hardmask 402 can in some scenarios be optional. For instance, a damascene process will be used to fill the trenches 504 and 506 with a conductive material (e.g., a metal). Thus, it may not be necessary in all cases to remove the hardmask in order to form functioning wires.

Figure 6:
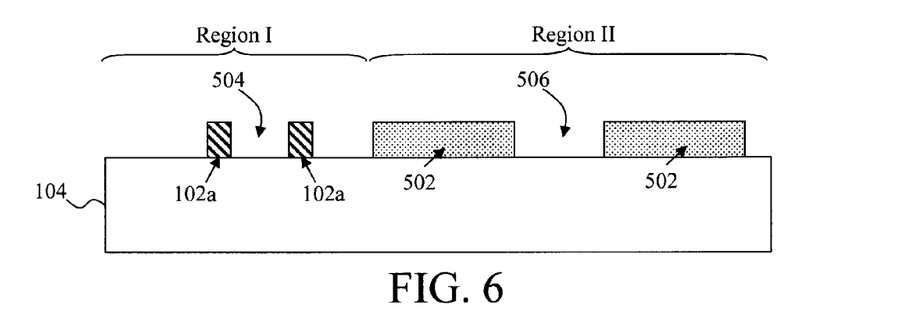
FIG. 6 is a cross-sectional diagram illustrating the patterned hardmask having been removed after the HSQ layer has been developed according to an embodiment of the present invention.

At this point in the process, a post-bake of the HSQ may be performed. This step serves to cross-link the optically defined portions of the HSQ. According to an exemplary embodiment, the post-bake includes heating the wafer at a temperature of from about 80° C. to about 300° C., and ranges therebetween, for a duration of from about 2 minutes to about 10 minutes, and ranges therebetween. While this post-bake step may be beneficial to fully cure (cross-link) the HSQ, doing so is optional since, as described above, the hardmask 402 serves to protect those uncross-linked portions of the HSQ that are to remain following the e-beam lithography phase. Thus, according to an exemplary embodiment, one way to distinguish the portions of the HSQ defined using e-beam lithography from those defined using optical lithography is that the e-beam lithography portions of the HSQ are cross-linked and the optical lithography portions of the HSQ are uncross-linked.

Figure 7:
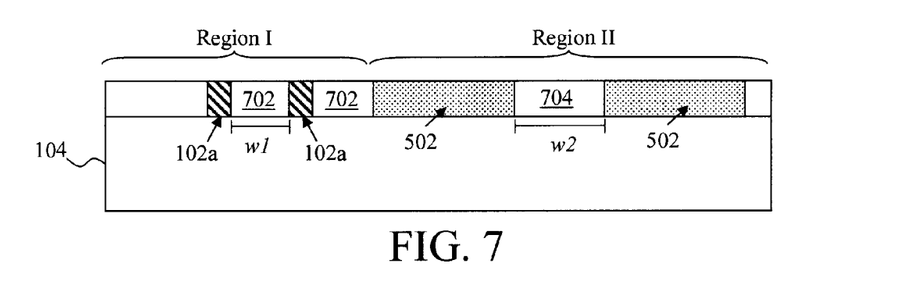
FIG. 7 is a cross-sectional diagram illustrating the trenches having been filled with a conductive material to form a metal wiring layer on the wafer (i.e., a semiconductor device wiring structure) according to an embodiment of the present invention.

Finally, as shown in FIG. 7, the trenches 504 and 506 are filled with a conductive material to form the metal wiring layer on the wafer. According to an exemplary embodiment, the conductive material is a metal, such as copper (Cu). The conductive material may be filled into the trenches so as to overfill, underfill, or (as shown in FIG. 7) be even (i.e., coplanar) with the surface of the HSQ (as now defined by the e-beam exposed portions 102a and the optically defined portions 502 of the HSQ layer). When the conductive material overfills the trenches, an etching process such as CMP (if so desired) can be used to polish the metal overfill down to the surface of the HSQ (as now defined by the e-beam exposed portions 102a and the optically defined portions 502 of the HSQ layer).

As a result of the present mixed e-beam/optical lithography approach, the resulting wiring layer now formed on wafer 104 contains both i) a dense wiring pattern on one or more first regions (e.g., Region I) of the wafer defined by the e-beam exposed HSQ including wires 702 and ii) a relaxed wiring pattern on one or more second regions (e.g., Region II) of the wafer defined by the optical lithography patterned HSQ including wires 704. See FIG. 7. As shown in FIG. 7, the e-beam exposed HSQ 102a of the HSQ layer serve as a dielectric between the wires 702 and the optically defined portions 502 of the HSQ layer serve as a dielectric between the wires 704.

As highlighted above, the present mixed lithography process in HSQ may be performed using an optical photoresist softmask rather than the above-described hardmask 402. Eliminating the hardmask streamlines the production process thereby increasing throughput and decreasing costs. The one caveat however is that care must be taken during development of the photoresist to insure that the solvents used do not affect the HSQ.

This alternative optical photoresist-based embodiment for forming a wiring layer entirely in HSQ is now described by way of reference to FIGS. 8-12. The process begins in the same manner whether a hardmask or softmask is used. Specifically, the process begins by depositing a layer of HSQ 102 onto the wafer 104. E-beam lithography is then used to expose one or more portions of the HSQ layer 102. These steps are described in detail above in conjunction with the description of FIGS. 1 and 2.

As above, the e-beam lithography serves to cross-link the portions of the HSQ to which it is exposed. It is notable that, according to this exemplary embodiment, not all of the uncross-linked HSQ remaining after the e-beam exposure will be removed. Specifically, one or more portions of the uncross-linked HSQ will (via optical lithography) be patterned to form a 'relaxed' portion of the wiring layer. As will be described in detail below, those uncross-linked portions of the HSQ that are to remain will be protected during development by a softmask.

Figure 8:
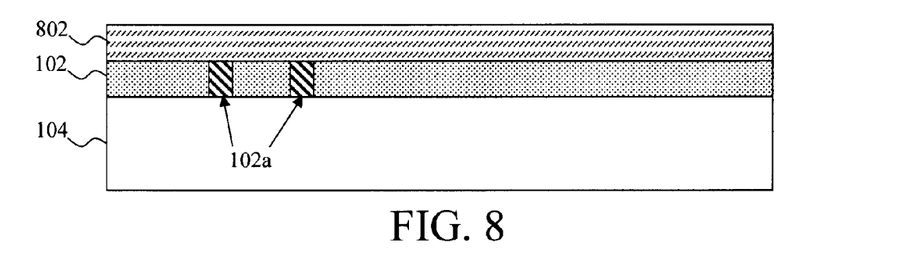
FIG. 8 is a cross-sectional diagram, which follows from FIG. 2, that illustrates in an alternative embodiment a photoresist material having been blanket deposited onto the HSQ layer according to an embodiment of the present invention.

Next, as shown in FIG. 8 of this alternative embodiment (which follows from FIG. 2) a photoresist material 802 is deposited onto the HSQ layer 102 (and onto the e-beam exposed portions 102a of the HSQ layer). According to an exemplary embodiment, the photoresist material 802 is a polymer resist compatible with 193 nm wavelength, 248 nm wavelength, i-line (365 nm wavelength), g-line (436 nm wavelength), and broad band optical exposure tools. Photoresist materials compatible with these processes would be apparent to one skilled in the art. The photoresist material may be deposited onto the HSQ layer 102 from a solution using a casting process, such as spin-coating. Spin-coating can be used to insure a uniform thickness. One notable qualification of the photoresist solution is that HSQ should be insoluble in the casting solvent(s) used in the photoresist solution (i.e., the solvent(s) will not dissolve HSQ). Positive and negative resist systems currently in use for 193 nm wavelength, 248 nm wavelength, i-line, g-line, and broad band optical exposure tools use photoresist casting solvents that will not dissolve HSQ. For instance, commercially available HSQ is often dissolved in a solvent such as methylisobutyl-ketone (MIBK). Accordingly, MIBK would not be a good choice for the photoresist casting solvent since it would dissolve the underlying HSQ. However, 1,2-propanediol monomethyl ether acetate (PGMEA), a common photoresist solvent would not dissolve the HSQ and thus would be a suitable casting solvent. One skilled in the art would be able to ascertain whether or not a given photoresist solvent is compatible with HSQ.

As is known in the art, the process for patterning a photoresist material, such as photoresist 802, generally involves exposing the photoresist to light through a mask (not shown) and then removing either the exposed (positive tone photoresist) or the unexposed (negative tone photoresist) portions of the photoresist with a developer. This patterning of the photoresist is the optical lithography phase which in combination with the previous e-beam exposure constitutes the mixed lithography aspect of the present techniques. It is notable that while the instant figures depict use of a negative tone photoresist, this is done merely to illustrate the overall mixed (e-beam/optical) lithography process in HSQ. The present techniques could be implemented using either a positive or negative tone photoresist.

Figure 9:
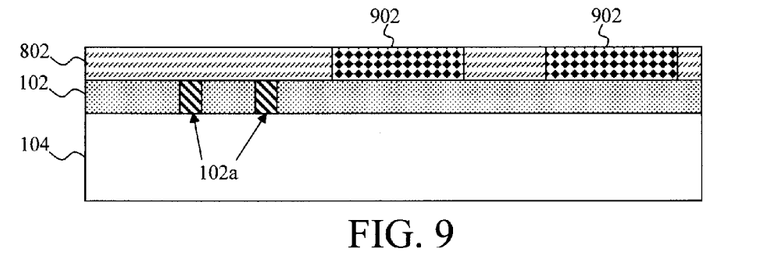
FIG. 9 is a cross-sectional diagram illustrating exposure of the photoresist material resulting in a latent image being formed in the photoresist material according to an embodiment of the present invention.
Figure 10:
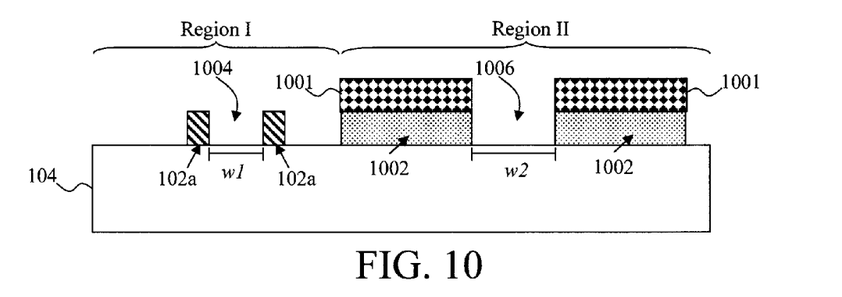
FIG. 10 is a cross-sectional diagram illustrating the photoresist material and the HSQ layer having been developed together (e.g., using a same common developer) which results in all but portions of the HSQ covered by the (patterned) photoresist material and the e-beam exposed HSQ having been removed forming multiple trenches in the HSQ layer according to an embodiment of the present invention.
Figure 11:
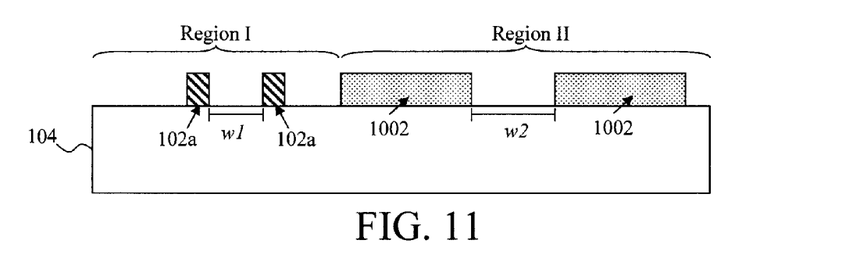
FIG. 11 is a cross-sectional diagram illustrating the photoresist material having been removed after the HSQ layer has been developed according to an embodiment of the present invention.

Further details of the photoresist patterning process as it pertains to the present techniques are shown in FIGS. 9 and 10. Specifically, as shown in FIG. 9, exposure of the photoresist results in a latent pattern image 902 being formed in the photoresist 802. Depending on the photoresist (positive tone or negative tone) the image 902 is then either soluble or insoluble in the respective developer.

Next, according to an exemplary embodiment, the photoresist 802 and the HSQ 102 are developed together. This means that the photoresist 802 and the HSQ 102 are developed at the same time (i.e., during the same step) using a same common developer. As described in detail above, HSQ should be insoluble in the casting solvent(s) for the photoresist material (as is the case for PGMEA). However, in this step the HSQ should be readily dissolved in the same developer as the photoresist material. By way of example only, a tetramethylammonium hydroxide (TMAH) solution (e.g., in either water or methanol) can be used as a common developer for the photoresist and HSQ. For instance, dipping the wafer in a TMAH solution can be used to remove both the soluble portions of the patterned photoresist and the uncross-linked HSQ not covered by the (now-patterned) photoresist (i.e., if the HSQ is not cured (cross-linked) developing the photoresist material with, e.g., TMAH, will effectively strip the exposed (uncross-linked) HSQ). Thus in the same developing step the developed/patterned photoresist (the patterned photoresist material now given reference numeral 1001) acts as softmask for the developing/patterning of the underlying HSQ. As shown in FIG. 10, portions 1002 of the HSQ which are uncross-linked, but covered by the patterned photoresist material 1001, as well as the e-beam exposed HSQ 102a will remain. While some lateral etching of HSQ portions 1002 by the developer might occur, the amount of lateral etching is insignificant compared to the overall surface area of the portions 1002 which are masked by patterned photoresist material 1001. This step reveals the HSQ pattern both in one or more of the first ("Region I"), e-beam lithography defined regions of the wafer and in one or more of the second ("Region II"), optical lithography defined regions of the wafer.

As shown in FIG. 10, multiple trenches are now present in the HSQ layer. As described above, the present mixed lithography approach permits e-beam lithography to be selectively employed in those regions of the wafer where smaller feature sizes are desired. For instance, in the exemplary embodiment illustrated in FIG. 10, the one or more (first) e-beam lithography patterned trenches (i.e., trenches 1004) formed in the first (e.g., dense) Region I of the wafer have smaller feature sizes relative to the one or more (second) optical lithography patterned trenches (i.e., trenches 1006) formed in the second (e.g., relaxed) Region II of the wafer. By way of example only, a feature size, e.g., a width w1 of each of the trenches 1004, is from about 10 nm to about 100 nm, and ranges therebetween, and a feature size, e.g., a width w2 of each of the trenches 1004 is from about 200 nm to about 1 μm, and ranges therebetween.

Following patterning of the HSQ, the remaining photoresist (i.e., patterned photoresist material 1001) can be removed using a standard photoresist stripper. See FIG. 11.

At this point in the process, a post-bake of the HSQ may be performed. This step serves to cross-link the optically defined portions of the HSQ. According to an exemplary embodiment, the post-bake includes heating the structure at a temperature of from about 80° C. to about 300° C., and ranges therebetween, for a duration of from about 2 minutes to about 10 minutes, and ranges therebetween. While this post-bake step may be beneficial to fully cure (cross-link) the HSQ, doing so is optional since, as described above, the photoresist was present to protect the portions of the HSQ in the optical lithography defined regions ("Region II") of the wafer. Thus, according to an exemplary embodiment, one way to distinguish the portions of the HSQ defined using e-beam lithography from those defined using optical lithography is that the e-beam lithography portions of the HSQ are cross-linked and the optical lithography portions of the HSQ are uncross-linked.

Figure 12:
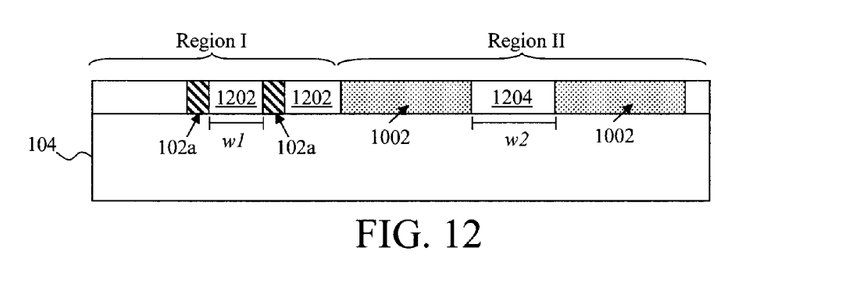
FIG. 12 is a cross-sectional diagram illustrating the trenches having been filled with a conductive material to form a metal wiring layer on the wafer (i.e., a semiconductor device wiring structure) according to an embodiment of the present invention.

Finally, as shown in FIG. 12, the trenches 1004 and 1006 are filled with a conductive material to form the metal wiring layer on the wafer. According to an exemplary embodiment, the conductive material is a metal, such as Cu. The conductive material may be filled into the trenches so as to overfill, underfill, or (as shown in FIG. 12) be even (i.e., coplanar) with the surface of the HSQ (as now defined by the e-beam exposed portions 102a and the optically defined portions 1002 of the HSQ layer). When the conductive material overfills the trenches, an etching process such as CMP (if so desired) can be used to polish the metal overfill down to the surface of the HSQ (as now defined by the e-beam exposed portions 102a and the optically defined portions 1002 of the HSQ layer).

As a result of the present mixed e-beam/optical lithography approach, the resulting wiring layer now formed on wafer 104 contains both i) a dense wiring pattern on one or more first regions (e.g., Region I) of the wafer defined by the e-beam exposed HSQ including wires 1202 and ii) a relaxed wiring pattern on one or more second regions (e.g., Region II) of the wafer defined by the optical lithography patterned HSQ including wires 1204. See FIG. 12. As shown in FIG. 12, the e-beam exposed HSQ 102a of the HSQ layer serve as a dielectric between the wires 1202 and the optically defined portions 1002 of the HSQ layer serve as a dielectric between the wires 1204.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a wiring layer on a wafer, the method comprising:
   depositing a layer of hydrogen silsesquioxane (HSQ) onto the wafer;
   cross-linking one or more first portions of the HSQ layer in a first region of the wafer using e-beam lithography;
   depositing a hardmask material onto the HSQ layer;
   patterning the hardmask material to form a patterned hardmask on the HSQ layer using optical lithography, wherein the patterned hardmask covers one or more second portions of the HSQ layer in a second region of the wafer;
   patterning the HSQ layer using the patterned hardmask in a manner such that i) the one or more first portions of the HSQ layer that are cross-linked remain in the first region of the wafer and ii) the one or more second portions of the HSQ layer covered by the patterned hardmask remain in the second region of the wafer, wherein by way of the patterning of the HSQ layer using the patterned hardmask one or more first trenches are formed in the HSQ layer in the first region of the wafer and one or more second trenches are formed in the HSQ layer in the second region of the wafer; and
   filling the one or more first trenches in the first region of the wafer and the one or more second trenches in the second region of the wafer with a conductive material to form the wiring layer on the wafer.

2. The method of claim 1, wherein the wafer comprises a bulk semiconductor wafer.

3. The method of claim 1, wherein the patterning of the HSQ layer using the patterned hardmask comprises:
   dipping the wafer in a developer solution to remove any exposed uncross-linked portions of the HSQ layer.

4. The method of claim 3, wherein the developer solution comprises tetramethylammonium hydroxide, sodium hydroxide, potassium hydroxide, or lithium hydroxide.

5. The method of claim 1, further comprising:
   heating the wafer at a temperature of from about 80° C. to about 300° C. for a duration of from about 2 minutes to about 10 minutes after the HSQ layer has been patterned.

6. The method of claim 1, wherein the conductive material comprises copper.

7. A method of forming a wiring layer on a wafer, the method comprising:
   depositing a layer of HSQ onto the wafer;
   cross-linking one or more first portions of the HSQ layer in a first region of the wafer using e-beam lithography;
   depositing a photoresist material onto the HSQ layer;
   patterning the photoresist material and the HSQ layer together using optical lithography such that the photoresist material, once patterned, covers one or more second portions of the HSQ layer in a second region of the wafer, wherein the patterning is carried out in a manner such that i) the one or more first portions of the HSQ layer that are cross-linked remain in the first region of the wafer and ii) the one or more second portions of the HSQ layer covered by the patterned photoresist material remain in the second region of the wafer, and wherein by way of the patterning one or more first trenches are formed in the HSQ layer in the first region of the wafer and one or more second trenches are formed in the HSQ layer in the second region of the wafer; and
   filling the one or more first trenches in the first region of the wafer and the one or more second trenches in the second region of the wafer with a conductive material to form the wiring layer on the wafer.

8. The method of claim 7, wherein the wafer comprises a bulk semiconductor wafer.

9. The method of claim 7, wherein the patterning comprises:
   developing the photoresist material and the HSQ layer together.

10. The method of claim 9, wherein the photoresist material and the HSQ layer are developed together using a same developer solution.

11. The method of claim 10, wherein the developer solution comprises tetramethylammonium hydroxide.

12. The method of claim 7, wherein the photoresist material is deposited onto the HSQ layer from a solution using a spin-coating process.

13. The method of claim 12, wherein the solution comprises a casting solvent in which HSQ is insoluble.

14. The method of claim 13, wherein the casting solvent comprises 1,2-propanediol monomethyl ether acetate.

15. The method of claim 7, further comprising:
   heating the wafer at a temperature of from about 80° C. to about 300° C. for a duration of from about 2 minutes to about 10 minutes after the patterning.

16. The method of claim 7, wherein the conductive material comprises copper.

* * * * *